(12) United States Patent
Lee et al.

(10) Patent No.: US 7,961,511 B2
(45) Date of Patent: Jun. 14, 2011

(54) HYBRID PROGRAMMING METHODS AND SYSTEMS FOR NON-VOLATILE MEMORY STORAGE ELEMENTS

(75) Inventors: Dana Lee, Saratoga, CA (US); Yingda Dong, Sunnyvale, CA (US); Changyuan Chen, Sunnyvale, CA (US); Jeffrey Lutze, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/535,452

(22) Filed: Sep. 26, 2006

(65) Prior Publication Data

US 2008/0084761 A1 Apr. 10, 2008

(51) Int. Cl.
*G11C 16/04* (2006.01)
(52) U.S. Cl. ......... 365/185.03; 365/185.28; 365/185.18; 365/185.19; 365/185.24
(58) Field of Classification Search ............. 365/185.18, 365/185.03, 189.29, 185.28, 185.19, 185.24
See application file for complete search history.

(56) References Cited

U.S. PATENT DOCUMENTS

| 5,280,446 | A | * | 1/1994 | Ma et al. ................ 365/185.15 |
| 5,406,521 | A | * | 4/1995 | Hara ....................... 365/185.25 |
| 5,521,867 | A | * | 5/1996 | Chen et al. .............. 365/185.33 |
| 5,621,684 | A | * | 4/1997 | Jung ....................... 365/185.17 |
| 5,761,121 | A | * | 6/1998 | Chang .................... 365/185.14 |
| 5,912,842 | A | * | 6/1999 | Chang et al. ........... 365/185.11 |
| 5,966,329 | A |   | 10/1999 | Hsu et al. |
| 5,969,987 | A | * | 10/1999 | Blyth et al. ............. 365/185.03 |
| 5,973,962 | A | * | 10/1999 | Kwon ..................... 365/185.18 |
| 6,044,015 | A | * | 3/2000 | Van Houdt et al. ..... 365/185.15 |
| 6,046,935 | A | * | 4/2000 | Takeuchi et al. ........ 365/185.03 |
| 6,160,737 | A | * | 12/2000 | Hsu et al. ................ 365/185.24 |
| 6,243,290 | B1 | * | 6/2001 | Kurata et al. ........... 365/185.03 |
| 6,392,931 | B1 | * | 5/2002 | Pasotti et al. ........... 365/185.19 |
| 6,529,410 | B1 |   | 3/2003 | Han et al. |
| 6,657,891 | B1 | * | 12/2003 | Shibata et al. .......... 365/185.03 |
| 6,807,095 | B2 | * | 10/2004 | Chen et al. ............. 365/185.02 |
| 6,897,522 | B2 | * | 5/2005 | Harari et al. ................. 257/324 |
| 6,975,537 | B2 | * | 12/2005 | Lutze et al. ............ 365/185.18 |
| 6,992,929 | B2 |   | 1/2006 | Chen et al. |
| 6,996,003 | B2 | * | 2/2006 | Li et al. .................. 365/185.02 |
| 7,020,017 | B2 | * | 3/2006 | Chen et al. ............. 365/185.03 |
| 7,035,146 | B2 | * | 4/2006 | Hemink et al. ......... 365/185.22 |
| 7,042,044 | B2 | * | 5/2006 | Wu ............................. 257/316 |

(Continued)

OTHER PUBLICATIONS

Montanari, D.; Van Houdt, J; Wellekens D.; Vanhorebeek, G.; Haspeslagh, L.; Deferm, L.; Groeseneken, G.; Maes, H.E.; Multi-level charge storage in source-side injection flash EEPROM; Non-volatile Memory Technology Conference, 1996., Sixth Biennial IEEE International; Jun. 24-26, 1996 pp. 80-83.*

(Continued)

*Primary Examiner* — Hoai V Ho
*Assistant Examiner* — Jay Radke
(74) *Attorney, Agent, or Firm* — Davis Wright Tremaine LLP

(57) ABSTRACT

A hybrid method of programming a non-volatile memory cell to a final programmed state is described. The method described is a more robust protocol suitable for reliably programming selected memory cells while eliminating programming disturbs. The hybrid method comprises programming the non-volatile memory cell to a first state according to a first coarse programming mechanism, and programming the non-volatile memory cell according to a second different more precise programming mechanism thereby completing the programming of the non-volatile memory cell to the final programmed state. Additionally, the described method is particularly advantageous for programming multilevel chips.

3 Claims, 10 Drawing Sheets

U.S. PATENT DOCUMENTS

| | | | | |
|---|---|---|---|---|
| 7,057,939 | B2* | 6/2006 | Li et al. | 365/185.28 |
| 7,110,298 | B2* | 9/2006 | Moogat et al. | 365/185.18 |
| 7,151,692 | B2* | 12/2006 | Wu | 365/185.03 |
| 7,230,847 | B2* | 6/2007 | Samachisa | 365/185.02 |
| 2002/0141240 | A1* | 10/2002 | Satoh et al. | 365/185.15 |
| 2003/0109093 | A1* | 6/2003 | Harari et al. | 438/200 |
| 2004/0170056 | A1* | 9/2004 | Shibata et al. | 365/185.03 |
| 2004/0196695 | A1* | 10/2004 | Tanaka et al. | 365/185.01 |
| 2005/0078527 | A1* | 4/2005 | Liu et al. | 365/185.29 |
| 2005/0127428 | A1* | 6/2005 | Mokhlesi et al. | 257/315 |
| 2005/0133860 | A1* | 6/2005 | Forbes | 257/330 |
| 2005/0157552 | A1* | 7/2005 | Hemink et al. | 365/185.03 |
| 2005/0162924 | A1* | 7/2005 | Guterman et al. | 365/185.28 |
| 2005/0265063 | A1* | 12/2005 | Forbes | 365/63 |
| 2007/0242514 | A1* | 10/2007 | Choi et al. | 365/185.17 |
| 2007/0257307 | A1* | 11/2007 | Chen | 257/324 |

OTHER PUBLICATIONS

Jae-Duk Lee et al., "A New Programming Disturbance Phenomenon in NAND Flash Memory by Source/Drain Hot-Electrons Generated by GIDL Current," Proceedings of IEEE 21$^{st}$ Non-Volatile Memory Semiconductor Workshop p31 (2006).

Yoocheol Shin et al., "A Novel NAND-type MONOS Memory using 63nm Process Technology for Multi-Gigabit Flash EEPROMs," IEDM Tech. Digest p. 337 (2005).

Ken'ichiro Sonoda et al., "Compact Modeling of Source-Side Injection Programming for 90nm-Node AG-AND Flash Memory," Int'l Conf. on Simulation of Semiconductor Processes and Devices, p. 123 (2005).

Dana Lee et al., "Vertical floating-gate 4.5F$^2$ Split-gate NOR Flash Memory at 110nm Node," Digest of Technical Papers, 2004 Symposium on VLSI Technology (2004).

Cheng-Yuan Hsu et al., "Split-Gate NAND Flash Memory at 120nm Technology Node Featuring Fast Programming and Erase," Digest of Technical Papers, 2004 Symposium on VLSI Technology (2004).

International Search Report dated Feb. 27, 2008 from corresponding International Application No. PCT/US2007/078774.

Written Opinion dated Feb. 27, 2008 from corresponding International Application No. PCT/US2007/078774.

* cited by examiner

HYBRID PROGRAMMING METHODS AND SYSTEMS FOR NON-VOLATILE MEMORY STORAGE ELEMENTS

FIELD OF THE INVENTION

The present invention relates generally to technology for programming memory devices. More particularly, the present invention relates to a hybrid approach to the programming of non-volatile memory devices, and particularly, flash memory devices.

BACKGROUND

Non-volatile semiconductor memory devices, and in particular flash memory devices, are becoming increasingly popular means of storage for small devices such as digital cameras, MP3 players, cellular telephones, personal digital assistants (PDAs), laptop computers, etc. Other forms of non-volatile memory include EPROM (Electrically Programmable Read Only Memory) and EEPROM (Electrically Erasable and Programmable Read Only Memory.

Unlike standard MOS transistors, flash memory cell transistors contain a floating gate that is electrically isolated and located between a control gate and typically a p-type substrate. Programming of a memory cell results in raising the threshold value of the transistor to a positive value as a result of electrons being injected through the insulating dielectric layer into the floating gate. Conversely, erasing results in lowering the threshold value of the transistor to a negative value as a result of electrons being removed from the floating gate. In this manner, the threshold value of the memory cell indicates its corresponding logic state. Programming is generally accomplished by using one of three major mechanisms: Fowler-Nordheim (FN) tunneling, source side [hot-electron] injection (SSI) and channel, or substrate, hot-electron injection (CHEI or SHEI).

When programming a memory cell string, there are various disturb mechanisms that tend to result in unintentional programming or erase. This problem is of particular concern when trying to program one cell on a wordline without programming the other cells on the same wordline. Since the program voltage is applied to all of the cells on a wordline during the programming of a selected cell, there exists a possibility that unselected cells may become inadvertently programmed (or erased) as well. Furthermore, the higher electric fields resulting as devices are scaled down in size and the source and drain junctions become more abrupt can lead to disturbs such as drain junction breakdown resulting in Gate Induced Drain Leakage (GIDL) whereby electrons leak into the boosted channel, and in particular, into the drain junction. Additionally, high electric fields can also lead to unintentional programming of unselected cells through FN tunneling, SSI and CHEI.

Various techniques, such as self boosting, local self boosting (LSB), and erased area self boosting (EASB), have improved the inhibition of program disturb, but still suffer from their own problems and fail to prevent program disturb in all instances. For example, in EASB, if the voltage applied to unselected wordlines is too low, channel boosting can be insufficient to prevent program disturb. Conversely, if this voltage is too high, there will be unintentional programming of memory cells on unselected wordlines as a result of tunneling. The three aforementioned techniques (and others known but not described herein) also suffer from a disturb mechanism that depends on whether or not the source-side neighbor cell is programmed. For example, if the source-side neighboring cell is programmed, it will have a negative charge on the floating gate. Since the control gate of the source side neighbor is at 0V, a highly reverse biased junction is created under the gate. This can lead to the phenomenon of GIDL resulting in a reduced boost potential, which can eventually lead to program disturb (in this case erasure). Conversely, if the source-side neighbor is erased, its threshold voltage is likely negative and the transistor of the cell may not turn off.

It has been observed that wordline zero (WL0) is particularly susceptible to certain program disturb mechanisms. This is a result of WL0 being positioned adjacent to the source select gate (select gate source or SGS), which is typically held at 0V during many programming methods (such as FN Tunneling) by the SGS line. This has the effect of creating a high electric field across the source of the transistor on WL0 which can cause program disturb What is needed is a more robust programming protocol suitable for reliably programming selected memory cells, and in particular, those memory cells on wordline 0 (WL0) most susceptible to programming disturbs.

SUMMARY

To achieve the foregoing and other objects of the invention, an improved method of programming a non-volatile memory cell to a final programmed state is described. The hybrid method described is a more robust protocol suitable for reliably programming selected memory cells while eliminating programming disturbs.

In one aspect of the invention, a hybrid method of programming a non-volatile memory cell to a final programmed state is described. The method comprises first programming the non-volatile memory cell to a first initial state according to a first initial programming mechanism. Subsequently, the non-volatile memory cell is programmed according to a second different programming mechanism thereby completing the programming of the non-volatile memory cell to the final programmed state. In described embodiments, the first mechanism is a coarse mechanism capable of moving the threshold voltage distributions by large amounts using only a few programming pulses, while the second mechanism is enabled to fine-tune the distributions to their final desired states.

In the described embodiments the non-volatile memory cell is one of a number of non-volatile memory cells arranged to form a non-volatile memory array suitable for storing data. The non-volatile memory array is arranged in a NAND-type memory array architecture having a number of wordlines and bitlines. Additionally, the described method is contemplated for use on a multilevel type memory array that when programmed stores data in the form of at least one lower page and at least one associated upper page. The described method is particularly advantageous for programming multilevel arrays where tighter more precisely positioned threshold voltage distributions are required. In a preferred embodiment of the present invention, the first programming mechanism is used to program the lower page of the multilevel array and the second programming mechanism is used to program the upper page.

In preferred embodiments, the first programming mechanism is based on Fowler-Nordheim (FN) Tunneling, while the second programming mechanism is based on source side injection (SSI). In other embodiments, second programming mechanisms based on gate induced drain leakage (GIDL) and/or substrate hot electron injection (SHEI) are contemplated for use.

It should be noted that the present invention is especially pertinent to memory cells being programmed on wordline zero (WL0). In fact, in some embodiments, the hybrid method is only employed to program WL0 because memory cells on WL0 are the most susceptible to program disturb mechanisms and, additionally, show the most improvement when programmed with the hybrid method of the present invention.

BRIEF DESCRIPTION OF THE DRAWINGS

The invention, together with further objects and advantages thereof, may best be understood by reference to the following description taken in conjunction with the accompanying drawings.

FIG. 4b illustrates a plot showing the splitting of the lower page states of FIG. 4a.

FIG. 4c illustrates a plot showing upper page states produced by splitting the lower page states of FIG. 4a.

In the drawings, like reference numerals designate like structural elements. Also, it should be understood that the depictions in the figures are not to scale.

DETAILED DESCRIPTION

In the following description, numerous specific details are set forth in order to provide a thorough understanding of the present invention. It will be apparent, however, to one skilled in the art that the present invention may be practiced without some or all of these specific details. In the description below, a memory cell is programmed according to two distinct programming mechanisms. The objective is to use a first programming mechanism that is fast, although course in its precision, to program the memory cell to a first state. Subsequently, a second slower, but much more precise, mechanism is used to fine-tune the memory cell to a final programmed state.

Figure 1:
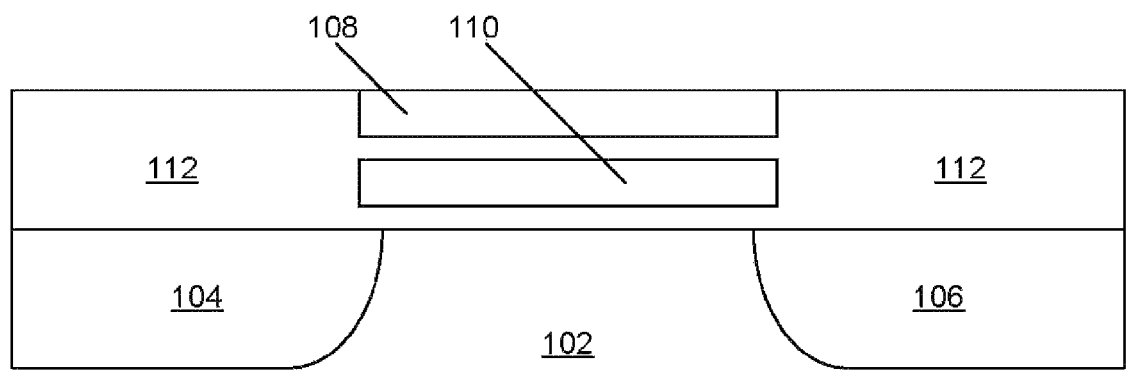
FIG. 1 illustrates an exemplary MOSFET having a floating gate.
Figure 2:
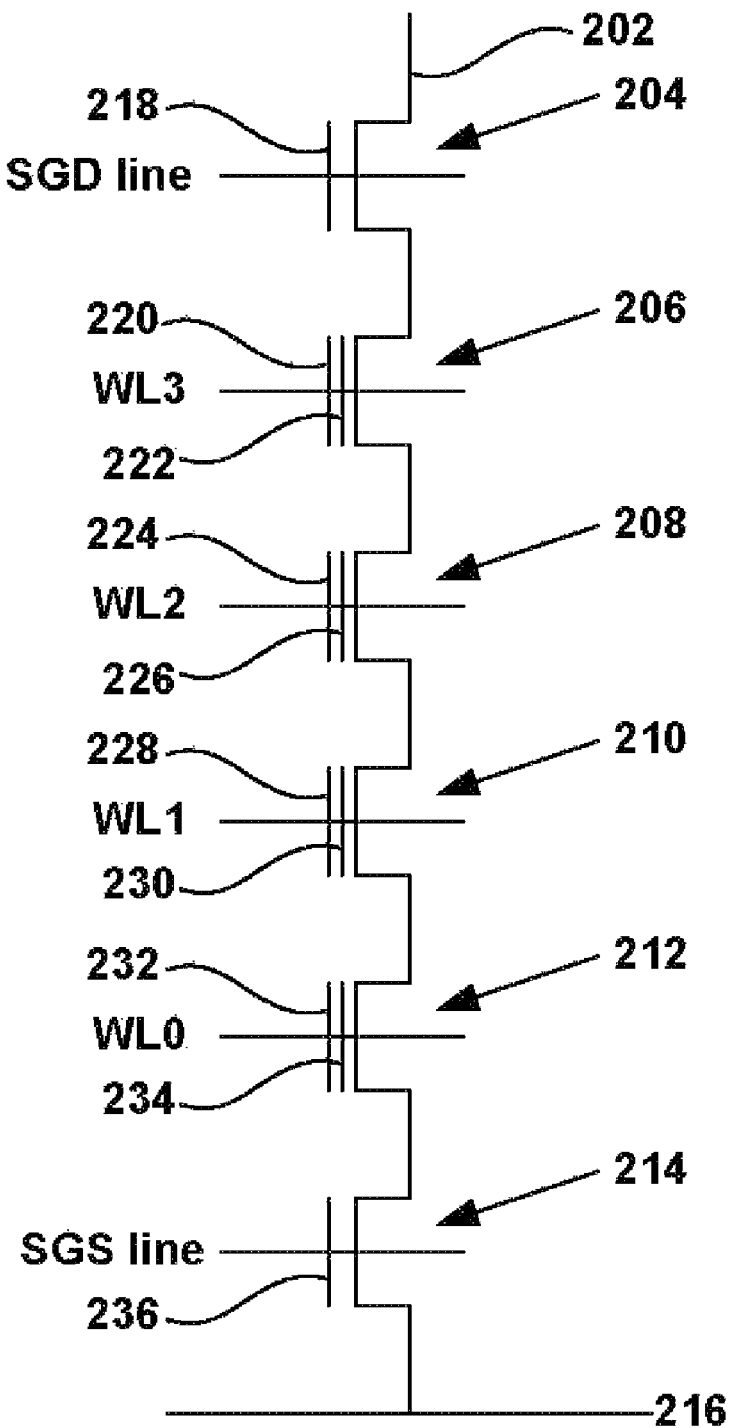
FIG. 2 illustrates an exemplary non-volatile memory string.
Figure 3:
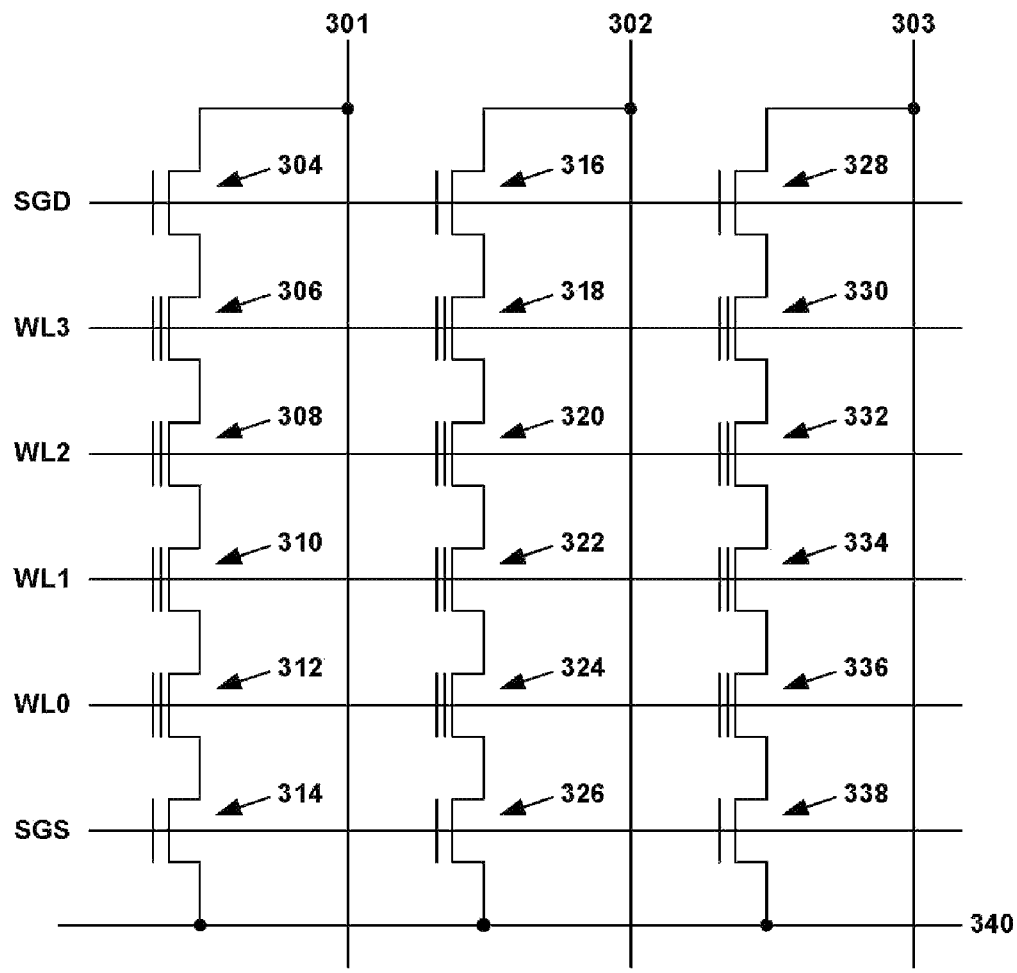
FIG. 3 illustrates an exemplary non-volatile memory array.

With reference to FIGS. 1, 2 and 3 an exemplary non-volatile memory storage array will be described. In the described embodiment, the non-volatile memory storage system is a flash memory chip having a NAND architecture, although the present invention is applicable to other forms of non-volatile memory including EPROM and EEPROM, and additionally to NOR architectures as well. In the described embodiment, the array consists of non-volatile memory storage elements that are p-type substrate floating gate MOSFETs. FIG. 1 illustrates an exemplary floating gate MOSFET, such as that used in this architecture, having a substrate 102, a source 104, a drain 106, a control gate 108, a floating gate 110, and a dielectric 112 surrounding the floating gate.

In NAND flash memory, a number of such transistors, also known hereafter as cells, memory cells or memory storage elements, are arranged in series. On either side of the series of memory cells is an additional transistor known as a select transistor, or gate. Collectively, the memory cells and two select gates are referred to as a NAND string. By way of illustration, the equivalent circuit of a 4-transistor NAND string is illustrated in FIG. 2. The four memory cells are labeled 206, 208, 210 and 212. The first select gate 204, referred to as the select gate drain (SGD), connects the NAND string to bitline 202. The second select gate 214, referred to as the select gate source (SGS), connects the NAND string to sourceline 216. Select gates 204 and 214 are controlled by control gates 218 and 236, respectively. An SGD line controls the control gate 218 for the select gate 204, while an SGS line controls the control gate 236 for the select gate 214. The four series transistors 206-212 each have both a control gate and a floating gate. For example, transistor 206 has a control gate 220 and a floating gate 222; transistor 208 has a control gate 224 and a floating gate 226; transistor 210 has a control gate 228 and a floating gate 230; and transistor 212 has a control gate 232 and a floating gate 234. Control gates 220, 224, 228 and 232 are connected to wordlines WL3, WL2, WL1 and WL0, respectively. It should be noted that although the example provided describes a NAND string that includes four memory cells, other numbers of cells may be arranged in series and are permissible as well.

FIG. 3 illustrates an example of a NAND string array showing three NAND strings 301, 302 and 303 of a memory array having many more NAND strings not shown. Like the string of FIG. 2, each of the NAND strings of FIG. 3 includes two select gates and four memory cells. For example, NAND string 301 includes select gates 304 and 314 as well as memory cells 306, 308, 310 and 312. Similarly, NAND string 302 includes select gates 316 and 326 as well as memory cells 318, 320, 322 and 324. Finally, NAND string 303 includes select gates 328 and 338 as well as memory cells 330, 332, 334 and 336. It should be noted that all control gates in a given row, or wordline, are connected. For example, WL0 connects the control gates of memory cells 312, 324 and 336. Each of the NAND strings are also connected to the same sourceline via select gates 314, 326 and 338. The SGS line controls the source side select gates 314, 326, and 338, while the SGD line controls the select gates 304, 316 and 328, which connect the NAND strings to their respective bitlines.

Such a memory array is also suitable for use in a multilevel chip (MLC). A MLC is a non-volatile memory chip capable of storing multiple bits of data at a single memory cell location. In physical construction, each memory cell of an MLC is generally no different than that used in a conventional non-volatile memory chip, the difference laying in the programming of each memory cell. As stated earlier, in a non-volatile memory cell, it is the level of the threshold voltage that distinguishes one logic state from another. By way of example, in a 4LC, each memory cell can be programmed into one of four possible threshold voltage levels. A first programming pass positions the threshold voltage of the cell into one of two states. Collectively, these states are referred to as a lower page. A second programming pass is then enabled to split one of the two aforementioned states by shifting the threshold voltage level to further program the cell. Collectively, these four possible secondary states are referred to as an upper page. Obviously, the threshold voltage levels in an MLC need to be more finely tuned than those in a standard memory chip, thereby rendering the multilevel chip more susceptible to programming disturbs.

Figure 4A:
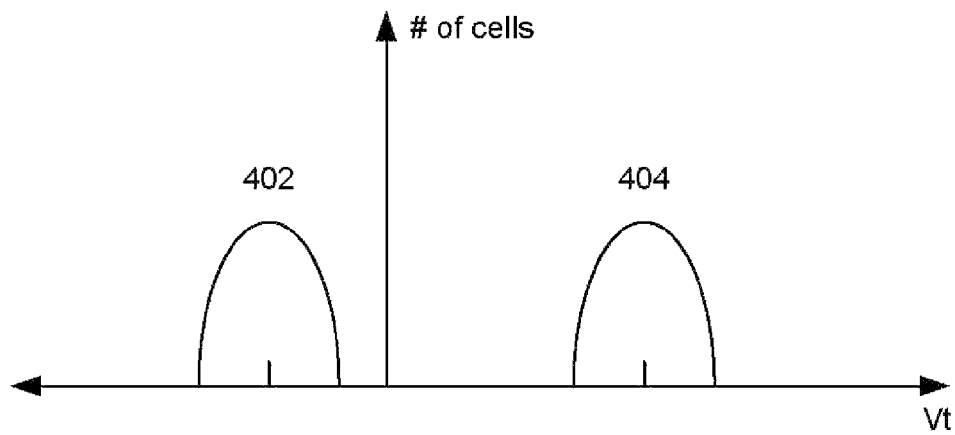
FIG. 4a illustrates a plot of lower page threshold voltage states versus # of cells.
Figure 4B:
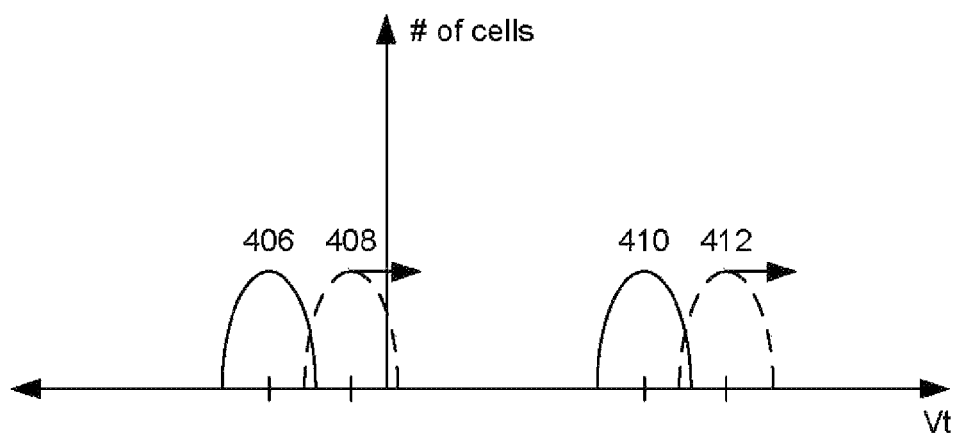
Figure 4C:
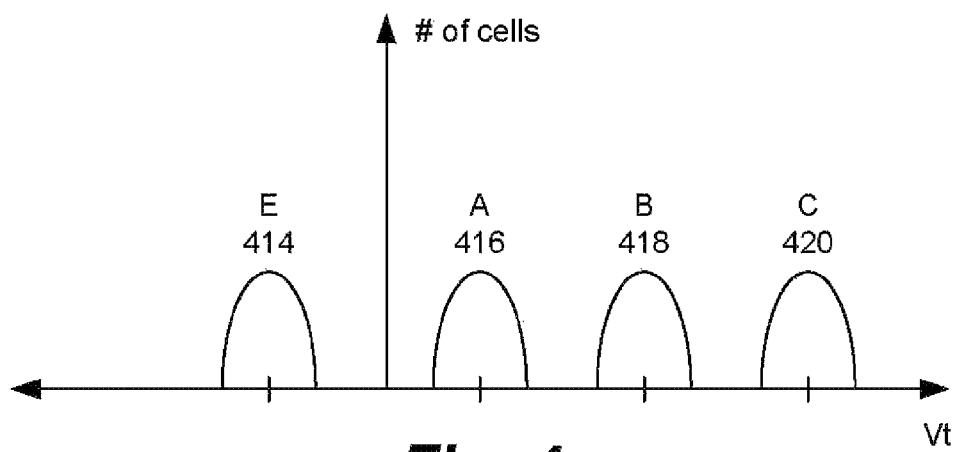

By way of example, in the case of a 4-level chip (4LC) wherein a memory cell is designed to store two bits of data (arranged as a lower page and a corresponding upper page) by means of programming a threshold value into one of four possible states (00, 01, 10, 11), the disturb may be severe enough such that only two states (i.e., a single bit) may be stored because the upper page states overlap and/or cannot be reliably distinguished from the lower page, as can be appreciated through examining FIG. 4 that illustrates three plots of threshold voltage distributions such as that may be observed in a 4LC. The lower page states 402 and 404 illustrated in FIG. 4a correspond to the erased (logic 1) distribution and programmed (logic 0) distribution, respectively. FIG. 4b illustrates a midway point in a second pass of programming in which midway distributions 406, 408, 410 and 412 are formed as the distributions 402 and 404 are being split into final programmed upper pages. The importance of having "tight" and properly positioned/spaced distributions of upper page states should be appreciated upon examination of FIG. 4b. FIG. 4c illustrates the final (sufficiently distributed) upper page states E 414, A 416, B 418 and C 420 representing logic 11, 10, 01, and 00, respectively, produced by splitting and shifting the lower page states.

Figure 5:
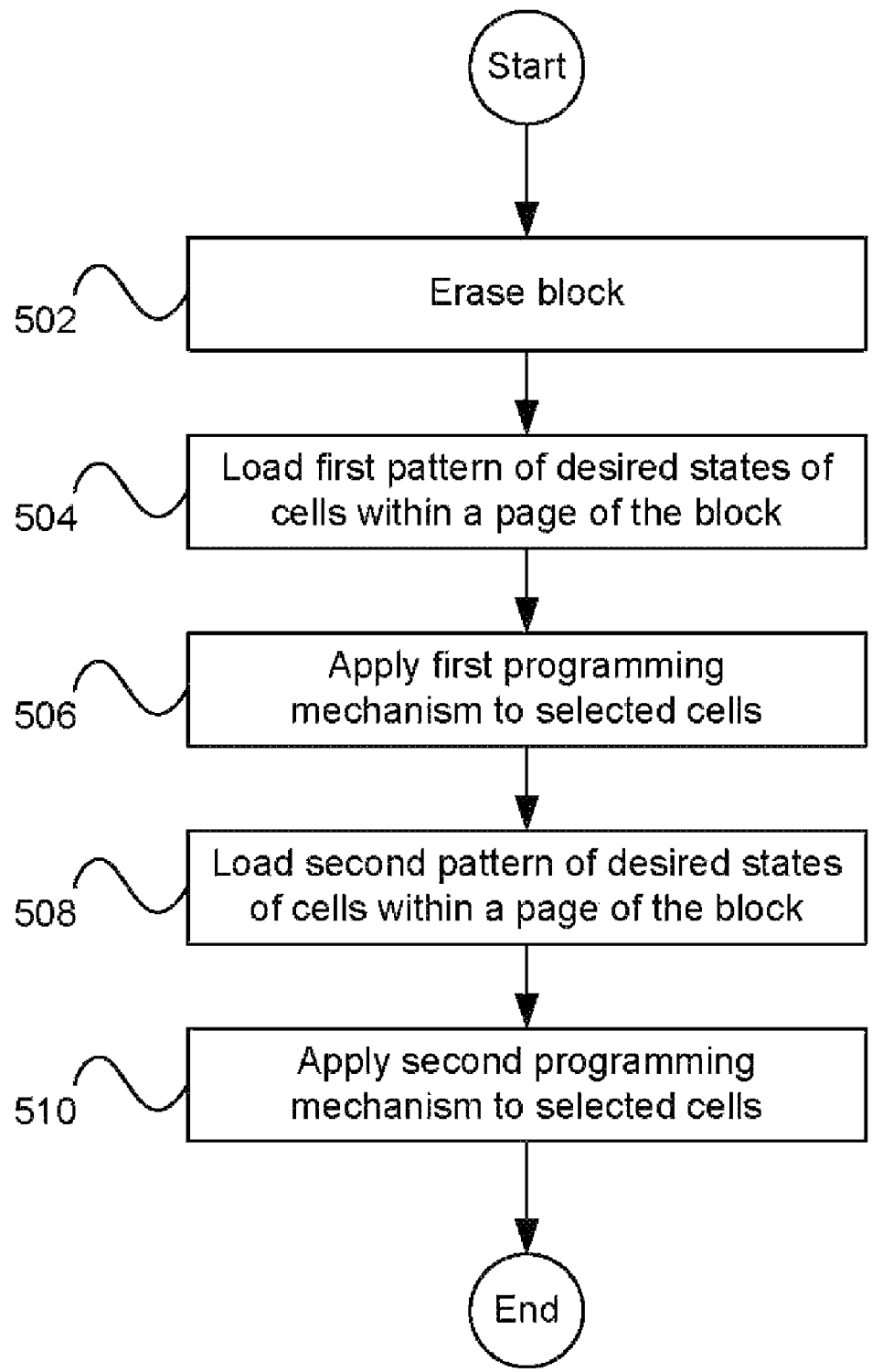
FIG. 5 shows a flowchart illustrating a hybrid algorithm of programming a non-volatile memory cell in accordance with an embodiment of the present invention.
Figure 8:
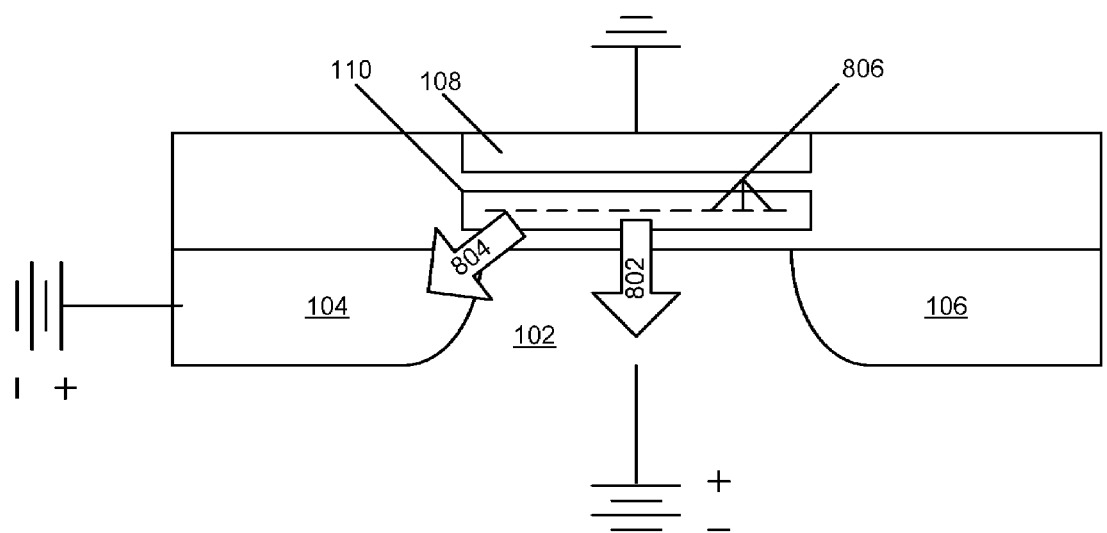
FIG. 8 illustrates the memory cell of FIG. 1 under erase bias conditions in accordance with an embodiment of the present invention.

Referring to FIG. 5, a hybrid method of programming a non-volatile memory storage element is described that substantially reduces the likelihood of programming disturb events especially with regards to wordline zero. In the described embodiment, at step 502, a selected block of memory cells is erased. In one example of an erase operation, the substrates of selected memory cells to be erased are raised to a large positive erase voltage (i.e. 16V) while the wordlines corresponding to the selected cells are simultaneously grounded and sources and bit-lines are floated. FIG. 8 illustrates the erase operation, in which arrows 802 and 804 indicate electron flows of the electrons 806 stored in the floating gate 110.

At step 504, a first pattern of desired states for selected cells within a page of the block is loaded. The programming algorithm then proceeds to step 506, where a first programming mechanism is used to program selected cells within the page. In a preferred embodiment, the programming operation is carried out using Fowler-Nordheim (FN) tunneling to initially program the selected memory cells. At step 508, a second pattern of desired states is loaded. The programming operation of the memory cell is then completed by way of a second programming mechanism at step 510 that brings the selected memory cells to final programmed states. In a preferred embodiment, the second mechanism is based on using SSI to program the selected memory cells. In other embodiments, GIDL or CHEI (SHEI) mechanisms may be used as the second mechanism. The second mechanism may also involve a combination of SSI, GIDL and CHEI.

The reason for the choices of FN tunneling and SSI as the first and second mechanisms, respectively, is that, based upon characterization, it has been found that FN tunneling typically moves the Vt distributions (FIGS. 4A-4C) by large amounts, while SSI, under normal bias conditions, typically moves the Vt distributions by small amounts. The reason for the latter is that it is known that disturbs such as SSI, GIDL and/or CHEI tend to move the Vt distributions by a fixed amount because electron injection is limited by the amount of charge in the channel connected to the drain of the transistor. Hence, a single programming pulse can only move the Vt distribution by a limited amount based on this limited quantity of charge. Consequently, SSI is slower and requires many more pulses, but allows for finer control than FN tunneling. Hence, by using the coarse FN tunneling mechanism to bring the Vt distributions close to their desired states, and subsequently, fine tuning the Vt distributions to their final programmed states with multiple pulses using SSI, a substantial reduction in the likelihood of program disturbs can be realized than would otherwise be possible using only FN tunneling, for example.

As already described, such a hybrid approach is particularly useful in MLCs where multiple pages are programmed. While it is desired that the programming operation proceed as fast as possible, it is also desired that the Vt distributions be tight (narrow) such that a wider read margin (distance between the distributions) is obtained. Thus, a fast approach, such as FN tunneling, is employed first, while a slower approach with the ability to more finely tune, such as SSI, is subsequently employed. It should also be noted that if multiple effects such as SSI, GIDL or SHEI occur, these effects are cooperative. That is, SSI, GIDL, and SHEI all move the selected distributions in the same direction. Therefore, even in the presence of multiple effects, unanticipated disturb will not occur. At most, these effects would cause variations in the programming rate. Furthermore, since the unselected bitlines are at zero or low bias, GIDL, SSI and SHEI should not occur on unselected bitlines. However, there does exist a need to ensure that Vpgm and Vpass are low enough to prevent Vpass disturbances due to tunneling.

The first and second programming mechanisms may be applied in any combination. In a preferred embodiment, however, the first mechanism is used to program a lower page of the memory chip while the second mechanism is used to program an upper page. This embodiment is preferred on one hand because the upper and lower pages are programmed during separate programming passes regardless of the algorithm, and thus, this provides a natural break in which to switch methods, but furthermore, programming of the lower page doesn't generally require the fine-tuning of the Vt distributions that is required when programming an upper page of an MLC.

In some embodiments, only WL0 is programmed using the hybrid method described herein. There are a few reasons for this, one of which is that it has been observed that WL0 is the most susceptible to certain program disturbs. In the described embodiment, SSI is used to program the upper page of WL0. It is easier to employ the SSI mechanism on WL0 than it is on the other wordlines because, for the case of WL0, the voltage required for SSI is fairly well known. The reason for this is that the SGS isn't programmed, and hence, it has a fairly fixed Vt. Examining other wordlines on the bitline, it is observed that the injector for the WL(n) gate becomes the WL(n−1) gate, and will have one of the plurality of possible threshold voltages described earlier. This makes the voltage required for SSI harder to find. For these reasons, the embodiments described herein focus on using the SSI mechanism for WL0, although SSI has been shown to work on other wordlines as well.

Figure 6:
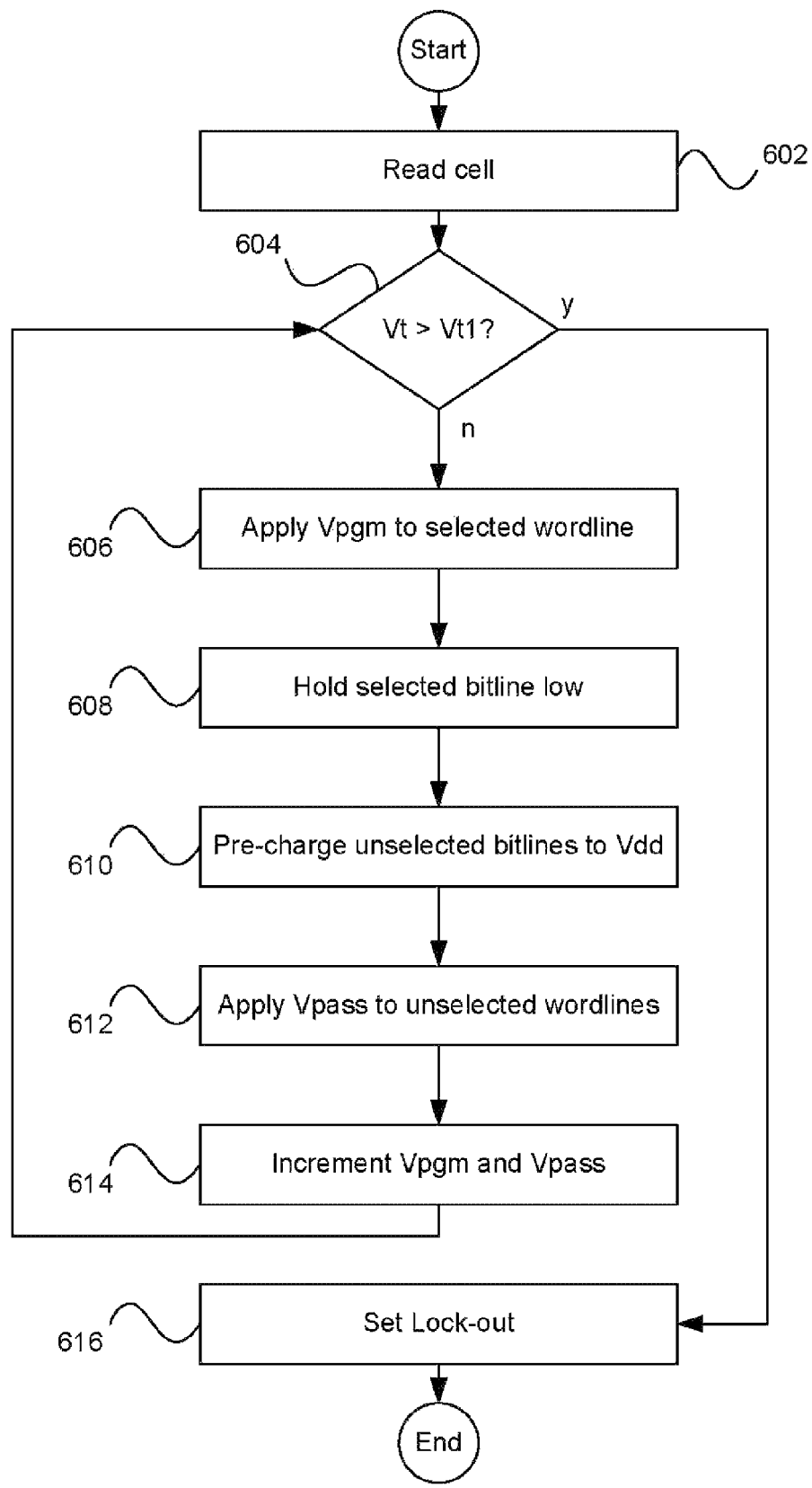
FIG. 6 shows a flowchart illustrating a first method of programming a non-volatile memory cell in accordance with an embodiment of the present invention.

FIG. 6 shows a flowchart illustrating a method of programming using FN tunneling. First, the cell is subjected to a read operation 602. During the read operation, the threshold voltage of the memory cell is verified. In step 604 it is then determined whether or not a first target verification voltage level, Vt1, is reached. If the threshold voltage of the memory cell is greater than Vt1, then the cell is locked-out in step 616.

If the threshold voltage is less than Vt1, then in step 606 a large positive bias, called a program voltage (i.e. 15V), is applied to the control gate of the selected memory cell by biasing the appropriate wordline (WL) while, in step 608, the associated bitline (BL) is held low at approximately 0 V. Additionally, in step 610, unselected bitlines are pre-charged to a high voltage, generally Vdd, while, in step 612, unselected wordlines are held at a passing voltage, Vpass, and the SGS is held at 0V. Next, Vpgm and Vpass are incremented in step 614 and the process is repeated until the condition 604 is satisfied. It should be noted that other biasing schemes for programming with FN tunneling are well known in the art and are permitted as well.

Figure 9:
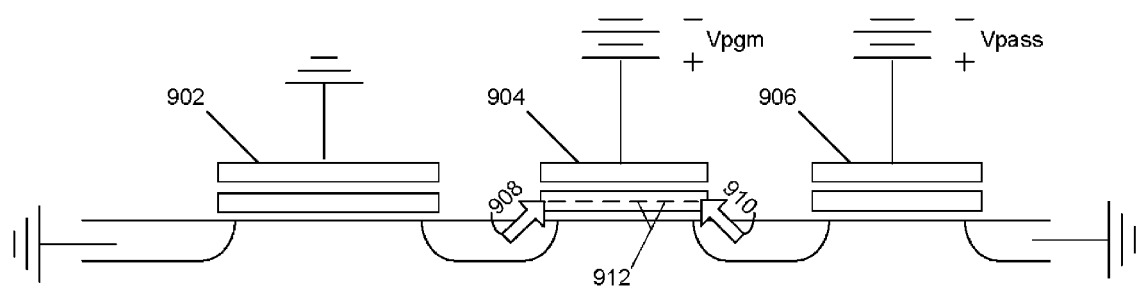
FIG. 9 illustrates a memory cell under FN tunneling programming bias conditions in accordance with an embodiment of the present invention.

The bias conditions described above for programming with FN tunneling are illustrated in FIG. 9, where a selected memory cell 904 on WL0 is being programmed. Adjacent to the cell 904 are a select gate source 902 connected to an SGS line and a second memory cell 906 connected to WL1. The arrows 908 and 910 indicate the direction the electrons 912 are traveling. FIG. 9 also clearly shows why WL0 is particularly susceptible to program disturb. With a large Vpgm (i.e. as high as 25 V) being applied to the selected cell and the SGS line being grounded, a large electric field is created in the n+ region between the two transistors. These electrons may, in turn, be injected into the floating gate of the selected memory cell. In contrast, when programming other memory cells on other wordlines besides WL0, the regions between the transistors don't typically experience such high fields because the neighboring cells will typically not be grounded.

Figure 7:
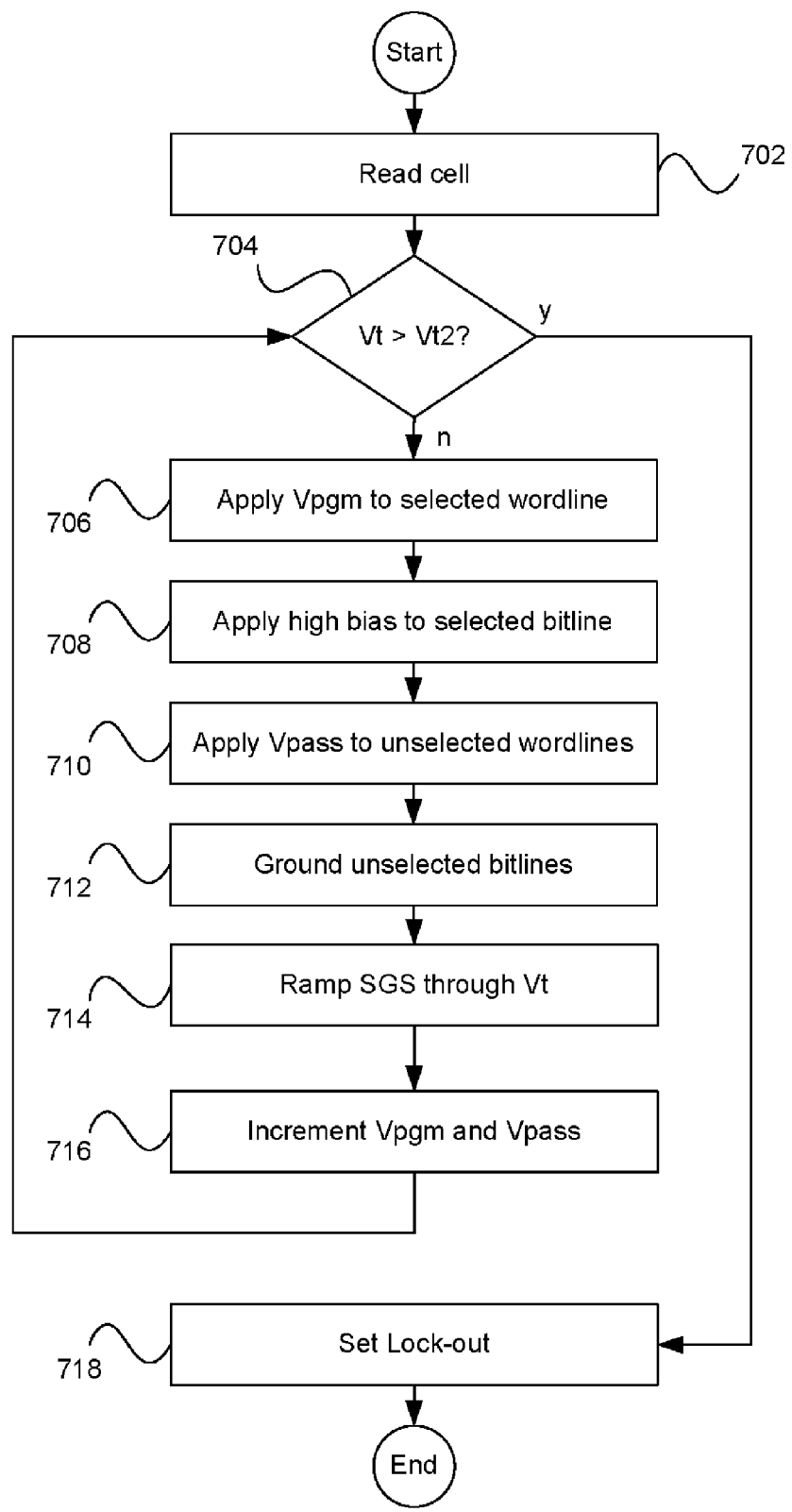
FIG. 7 shows a flowchart illustrating a second method of programming a non-volatile memory cell in accordance with an embodiment of the present invention.

FIG. 7 shows a flowchart illustrating a method of programming using SSI. SSI is a method of programming whereby electrons are injected from the drain of one transistor into the gate above the source of an adjacent transistor. When programming with SSI, many of the bitline bias senses are reversed with respect to FN tunneling. In the described embodiment, the cell is first subjected to a read operation 702. During the read operation, the threshold voltage of the memory cell is verified. In step 704 it is then determined whether or not a second target verification voltage level, Vt2, is reached. If the threshold voltage of the memory cell is greater than Vt2, the cell is locked-out in step 718. If the threshold voltage is less than Vt2, then in step 706 a high positive program voltage, Vpgm, is applied to the control gate of the selected memory cell by biasing the appropriate wordline while, in step 708, a high bias (4-5 V) is applied to the selected bitline. In step 710, unselected wordlines are held at a passing voltage, Vpass, while, in step 712, unselected bitlines are grounded. In step 714, the SGS line is ramped from 0V until the threshold voltage of the select gate source is surpassed. It is around this threshold voltage that SSI begins. It should be noted that the SGS line is ramped so as to guarantee that the bias supplied to the SGS passes Vt. In this manner, the floating gate of the selected cell on WL0 serves as a collector of electrons and the SGS serves as the injector. Next, Vpgm and Vpass are incremented in step 716 and the process is repeated until the condition 704 is satisfied.

Figure 10:
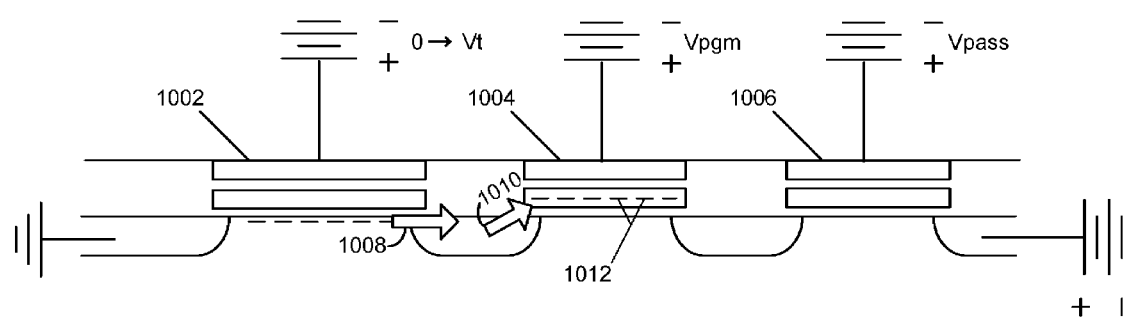
FIG. 10 illustrates a memory cell under SSI programming bias conditions in accordance with an embodiment of the present invention.

The bias conditions described above for SSI programming are illustrated in FIG. 10, where a selected memory cell 1004 on WL0 is being programmed. Adjacent to the cell 1004 are a select gate source 1002 connected to an SGS line and a second memory cell 1006 connected to WL1. The arrows 1008 and 1010 indicate the direction the electrons 1012 are traveling. When the source select gate is ramped through its Vt, a conducting channel of electrons is created between its source and drain. Since the unselected wordlines are held at a passing voltage, the bias applied to the selected bitline draws electrons from the select gate source into the source of the selected memory cell 1004. The large Vpgm applied to the control gate of cell 1004 causes electrons in the source to be injected into the floating gate of the cell 1004.

It should be noted that other biasing schemes for programming with SSI are well known in the art and are permitted as well. For example, there are boost-based schemes for boosting the channel voltage in a selected memory cell. In such schemes, the selected wordline is often biased to Vdd while unselected wordlines are biased with a voltage, Vboost, which is greater than Vpass. Such boosting schemes take advantage of the channel capacitance of unselected cells. Hence, the strength of boosting increases as the number of wordlines increases and scales down as the device geometries scale down. Alternatively, the much larger BL capacitance can be used to provide the boost.

It should be additionally noted that SSI is very efficient in generating hot electrons in the channel of the selected transistor receiving the electrons and also provides very high efficiency in collecting these channel hot electrons into the floating gate. SSI also requires significantly less current than other modes of programming, improves reliability and allows for re-programming using on-chip charge pumps.

Although only a few embodiments of the invention have been described in detail, it should be appreciated that the invention may be implemented in many other forms without departing from the spirit or scope of the invention. By way of example, the invention may be implemented as a device that includes computer code stored on a computer readable medium for using a first programming mechanism to program a non-volatile memory cell to a first programmed state, and computer code stored on a computer readable medium for using a second programming mechanism to program the non-volatile memory cell from the first programmed state to a final programmed state. Although specific features and conditions have been described, it should be appreciated that a wide variety of implementations, such as bias conditions and method combinations, may be modified and employed as well. In addition, although in physical construction the present invention is applied to a conventional non-volatile memory system without modification, it should be appreciated by one skilled in the art that the structure could be modified to enhance the effects of the present invention. Accordingly, the present embodiments are to be considered as illustrative and not restrictive and the invention is not to be limited to the details given herein, but may be modified within the scope of the appended claims.

The invention claimed is:

1. A method of writing a cell of a non-volatile memory to a final programmed state, the method comprising:
    writing a first cell of the memory from an initial state to a first intermediate programmed state using only a first programming mechanism; and
    subsequently writing the first cell from the first intermediate state to a final programmed state using only a second programming mechanism,
    wherein the first cell has a charge storage region over a channel formed between a source region and a drain region and a control gate formed over the charge storage region;
    wherein the first programming mechanism differs from the second programming mechanism in that, during a programming operation, one of the programming mechanisms biases the source and drain regions to have no current flowing therebetween and applies a voltage to the control gate induce tunneling of charge to the charge storage region and the other of the programming mechanisms biases the source and drain regions to have a current flowing therebetween and a voltage is applied to the control gate to induce hot electron injection into the charge storage region, and wherein the cells of the non-volatile memory are multi-level cells that store data in a multi-page format and the first intermediate programmed state corresponds to data from a lower data page and final programmed state includes data corresponding to an upper data page.

2. The method of claim 1, wherein writing the first cell to a first intermediate programmed state corresponds to a coarse programming mode and the writing the first cell to the final programmed state corresponds to a fine programming mode.

3. A method of writing a cell of a non-volatile memory to a final programmed state the method comprising:

writing a first cell of the memory from an initial state to a first intermediate programmed state using only a first programming mechanism; and subsequently writing the first cell from the first intermediate state to a final programmed state using only a second programming mechanism, wherein the first cell has a charge storage region over a channel formed between a source region and a drain region and a control gate formed over the charge storage region, wherein the first programming mechanism differs from the second programming mechanism in that, during a programming operation, one of the programming mechanisms biases the source and drain regions to have no current flowing therebetween and applies a voltage to the control gate induce tunneling of charge to the charge storage region and the other of the programming mechanisms biases the source and drain regions to have a current flowing therebetween and a voltage is applied to the control gate to induce hot electron injection into the charge storage region, and wherein the memory has a NAND architecture formed of a plurality of NAND strings, each NAND string including a plurality of memory cells connected in series between a source side select gate and a drain side select gate, and wherein the first cell is adjacent to the source side select gate in a first NAND string, the method further comprising:

writing a second cell in the first NAND string of the memory from an initial state to a final programmed state using the first programming mechanism, wherein writing the second cell from an initial state to a final programmed state using the first programming mechanism includes writing the second cell from the initial state to a first intermediate programmed state using the first programming mechanism; and subsequently writing the second cell from the first intermediate state to the final programmed state using the first programming mechanism.

* * * * *